(12) United States Patent
Uya (10) Patent No.: US 7,704,775 B2
(45) Date of Patent: Apr. 27, 2010

(54) CCD TYPE SOLID-STATE IMAGING APPARATUS AND MANUFACTURING METHOD FOR THE SAME

(75) Inventor: Shinji Uya, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 970 days.

(21) Appl. No.: 11/455,102

(22) Filed: Jun. 19, 2006

(65) Prior Publication Data

US 2006/0290799 A1    Dec. 28, 2006

(30) Foreign Application Priority Data

Jun. 27, 2005   (JP) ................ P.2005-186488

(51) Int. Cl.
  *H01L 21/00* (2006.01)
(52) U.S. Cl. ............ 438/60; 438/75; 438/144; 257/E21.185
(58) Field of Classification Search ............ 438/60, 438/75, 144–148; 257/215–251, E21.185
See application file for complete search history.

(56) References Cited

U.S. PATENT DOCUMENTS

| 3,758,794 | A | * | 9/1973 | Kosonocky | 377/63 |
| 3,863,065 | A | * | 1/1975 | Kosonocky et al. | 257/222 |
| 4,019,247 | A | * | 4/1977 | Borel et al. | 438/144 |
| 4,081,841 | A | * | 3/1978 | Ochi et al. | 348/315 |
| 5,858,811 | A | * | 1/1999 | Tohyama | 438/75 |
| 2008/0213935 | A1 | * | 9/2008 | Tsukamoto | 438/60 |

FOREIGN PATENT DOCUMENTS

JP    2-62170 A    3/1990

* cited by examiner

*Primary Examiner*—Richard A. Booth
(74) *Attorney, Agent, or Firm*—Birch Stewart, Kolasch & Birch, LLP (57) ABSTRACT

The invention provides CCD type solid-state imaging apparatus comprises: photoelectric conversion elements; a plurality of first transfer paths extending in a first direction; and second transfer paths extending in a first direction; the first transfer paths and the second transfer paths respectively including a plurality of discretely formed first layer transfer electrode films and second layer transfer electrode films formed between the first layer transfer electrode films and whose ends are laminated on the ends of the adjacent first layer transfer electrode films via insulating films. The thickness of the insulating film between the first layer transfer electrode film and the second layer transfer electrode film constituting the second transfer path shown is smaller than the thickness of the insulating film between the first layer transfer electrode film and the second layer transfer electrode film constituting the first transfer path shown.

2 Claims, 6 Drawing Sheets

CCD TYPE SOLID-STATE IMAGING APPARATUS AND MANUFACTURING METHOD FOR THE SAME

BACKGROUND OF THE INVENTION

1. Field of the Invention

The present invention relates to solid-state imaging apparatus of the CCD (charge coupled device) type, and in particular to a CCD type solid-state imaging apparatus preferable for reducing power consumption and a manufacturing method for the same.

2. Description of the Related Art

For example, as described in JP-A-02-62170, CCD type solid-state imaging apparatus comprises a vertical transfer path (VCCD) for reading signal charges accumulated in a photoelectric conversion part in accordance with the light receiving quantity and transferring the signal charges in a first direction and a horizontal transfer path (HCCD) for receiving the signal charges transferred by the vertical transfer path, transferring the signal charges in a second direction, and outputting the signal charges from the solid-state imaging apparatus.

Figure 17A:
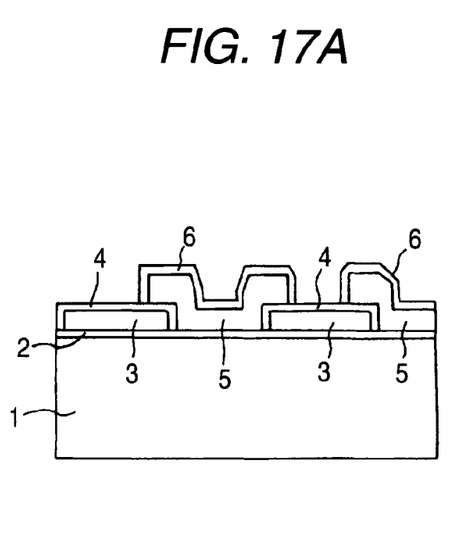
FIG. 17A is a partial schematic cross-sectional view of a horizontal transfer path of the related art CCD type solid-state imaging apparatus.
Figure 17B:
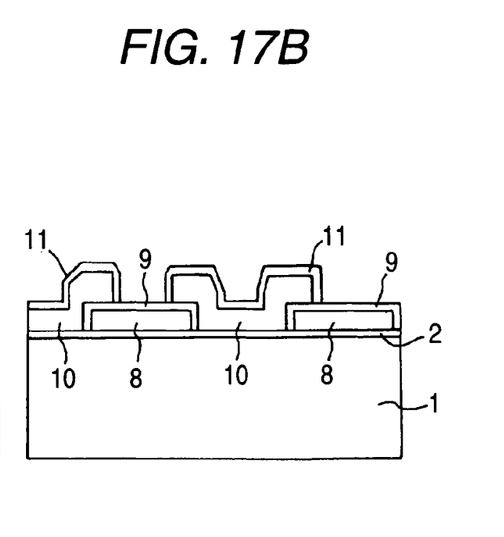
FIG. 17B is a partial schematic cross-sectional view of a horizontal transfer path of the related art CCD type solid-state imaging apparatus.

FIG. 17A is a partial schematic cross-sectional view of a related art horizontal transfer path (HCCD). FIG. 17B is a partial schematic cross-sectional view of a related art vertical transfer path (VCCD). Both the horizontal transfer path and the vertical transfer path include transfer electrodes formed on a semiconductor substrate 1 via a gate insulating film 2. The illustrated example shows a two-layer transfer electrode. On the horizontal transfer path (FIG. 17A), a plurality of first layer transfer electrode films 3 composed of polysilicon are formed apart from each other on the insulating film 2. An oxidized insulating film 4 is formed on the surface of the first layer transfer electrode film 3 and second layer transfer electrode films 5 composed of polysilicon are formed so as to fill gaps between the first layer transfer electrode films 3. On the surface of the second layer transfer electrode film 5 is formed an oxidized insulating film 6.

On the vertical transfer path (FIG. 17B) also, a plurality of first layer transfer electrode films 8 are formed apart from each other on the gate insulating film 2. An oxidized insulating film 9 is formed on the surface of the first layer transfer electrode film 8 and second layer transfer electrode films 10 composed of polysilicon are formed so as to fill gaps between the first layer transfer electrode films 8. On the surface of the second layer transfer electrode film 10 is formed an oxidized insulating film 11.

The horizontal transfer path and the vertical transfer path of related art CCD type solid-state imaging apparatus are manufactured in the same manufacturing process, so that the interlayer insulating film 4 of the horizontal transfer path has the same film thickness as the interlayer insulating film 9 of the vertical transfer path.

In case CCD type solid-state imaging apparatus is driven, signal charges in a single row of photoelectric conversion elements arranged in parallel with the horizontal transfer path are transferred to the horizontal transfer path. The horizontal transfer path is driven for transfer so as to output all signals corresponding to the signal charges in the single row from the solid-state imaging apparatus. Signal charges in the next row of photoelectric conversion elements are then transferred to the horizontal transfer path. This sequence is repeated. It is thus necessary to perform transfer driving of the horizontal transfer path at a higher speed than that of the vertical transfer path.

The horizontal transfer path that is typically driven at a high frequency of 12 to 36 MHz is one of the most power-consuming components of solid-state imaging apparatus. Power consumption of the horizontal transfer path is proportional to the square of the driving voltage of the horizontal transfer path (typically 0V for a low level and 3.3V for a high level). Reduction of the driving voltage can reduce the power consumption of the CCD type solid-state imaging apparatus.

Experiments by the inventor have proven that it is possible to reduce the driving voltage of the horizontal transfer path by providing a thinner interlayer insulating film 4 shown in FIG. 17A. The problem is that, in the manufacturing process of related art CCD type solid-state imaging apparatus, the interlayer insulating film 4 of the horizontal transfer path has the same film thickness as the interlayer insulating film 9 of the vertical transfer path, so that the withstand voltage across the electrode films 8 and 10 of the vertical transfer path that requires a larger driving voltage (typically –8V for a low level and 0V for a high level) limits the reduction of the thickness of the interlayer insulating film 4.

SUMMARY OF THE INVENTION

An object of the invention is to provide CCD type solid-state imaging apparatus capable of reducing the driving voltage of a horizontal transfer path to reduce power consumption and its manufacturing method.

The invention provides CCD type solid-state imaging apparatus comprising: a semiconductor substrate; a plurality of photoelectric conversion elements two-dimensionally arranged and formed on the surface of the semiconductor substrate so as to form a plurality of rows, each comprising a set of photoelectric conversion elements arranged in a first direction, being formed in a second direction orthogonal to the first direction; first transfer paths each of which is formed along each of the rows of the photoelectric conversion elements and comprises (i) first layer transfer electrode films separated in the first direction and (ii) second layer transfer electrode films formed between the first layer transfer electrode films and whose ends are laminated on ends of the first layer transfer electrode films of the first transfer paths via insulating films; and a second transfer path that receives light-receiving charges of the photoelectric conversion elements transferred by the first layer transfer paths and transfers the light-receiving charges in the second direction, the second transfer path comprising (iii) first layer transfer electrode films separated in the second direction and (iv) second layer transfer electrode films formed between the first layer transfer electrode films and whose ends are laminated on ends of the first layer transfer electrode films of the second transfer path via insulating films, wherein thickness of the insulating films between the first layer transfer electrode films and the second layer transfer electrode films constituting the second transfer path is smaller than that of the insulating films between the first layer transfer electrode films and the second layer transfer electrode films constituting the first transfer paths.

The invention provides a method for manufacturing CCD type solid-state imaging apparatus, the method comprising: forming a first insulating film on a semiconductor substrate; forming, on the first insulating film, a plurality of separated first layer transfer electrode films constituting the first transfer paths and the second transfer path; forming first oxidized films on surfaces of the first layer transfer electrode films by way of a first oxidization process; forming a second insulating film covering the first transfer paths and the second transfer path; removing the second insulating film on the first transfer path by way of a photolithography process; growing the first oxidized films on the surfaces of the first layer transfer electrode films on the first transfer path; removing the second insulating film on the second transfer path; and forming a plurality of second layer transfer electrode films filling gaps between the first layer transfer electrode films and whose ends are laminated on ends of the first layer transfer electrode films adjacent thereto.

The invention provides a method for manufacturing CCD type solid-state imaging apparatus, the method comprising: forming a first insulating film on a semiconductor substrate; forming, on the first insulating film, a plurality of separated first layer transfer electrode films constituting the first transfer paths and the second transfer path; forming first oxidized films on a surface of the first layer transfer electrode films by way of a first oxidization process; removing the first oxidized films on surfaces of the first layer transfer electrode films on the first transfer paths by way of a photolithography process; growing an oxidized film on each of surfaces of the first layer transfer electrode films on the first transfer paths and surfaces of the first layer transfer electrode films on the second transfer path by way of a second oxidization process; and forming a plurality of second layer transfer electrode films filling gaps between the first layer transfer electrode films and whose ends are laminated on ends of the first layer transfer electrode films adjacent thereto.

DETAILED DESCRIPTION OF THE INVENTION

An embodiment of the invention will be described referring to drawings.

First Embodiment

Figure 1:
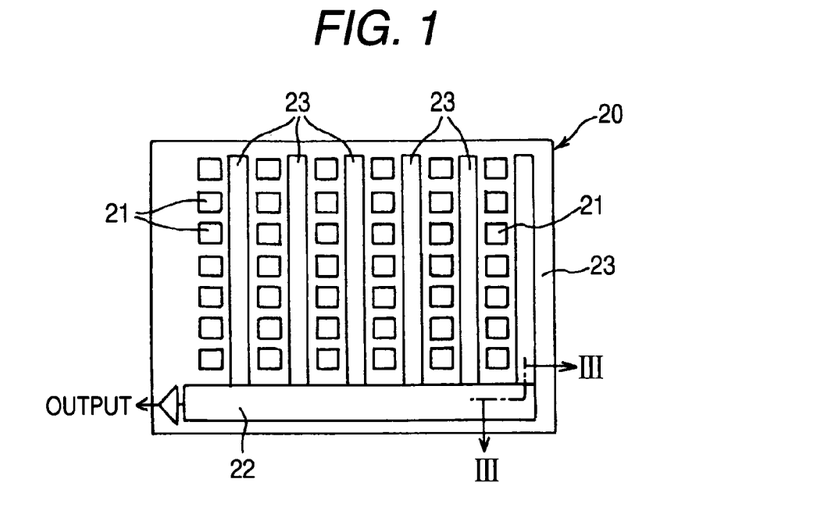
FIG. 1 is a surface schematic view of CCD type solid-state imaging apparatus according to the first embodiment of the invention.

FIG. 1 is a surface schematic view of CCD type solid-state imaging apparatus according to the first embodiment of the invention. The CCD type solid-state imaging apparatus 20 comprises numerous photoelectric conversion elements 21 arranged and formed in the shape of a matrix, a single horizontal transfer path 22 provided at a bottom side, and a plurality of vertical transfer paths 23 arranged adjacent to the right side of the photoelectric conversion elements 21 arranged in vertical direction.

Figure 2A:
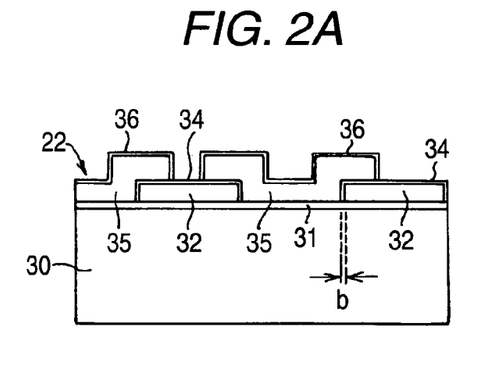
FIG. 2A is a partial schematic cross-sectional view of the horizontal transfer path of the CCD type solid-state imaging apparatus shown in FIG. 1.
Figure 2B:
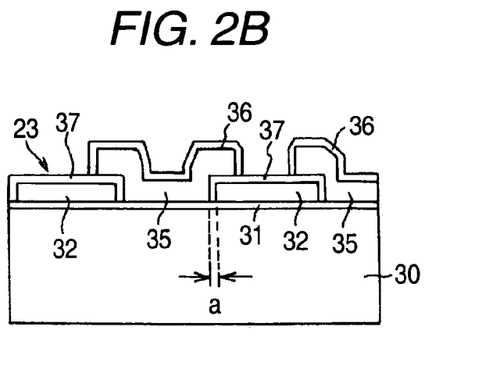
FIG. 2B is a partial schematic cross-sectional view of the vertical transfer path of the CCD type solid-state imaging apparatus shown in FIG. 1.

FIG. 2A is a partial schematic cross-sectional view of the horizontal transfer path 22. FIG. 2B is a partial schematic cross-sectional view of the vertical transfer path 23. Both the horizontal transfer path 22 and the vertical transfer path 23 include transfer electrodes formed on a semiconductor substrate 30 via a gate insulating film 31. The illustrated example shows a two-layer transfer electrode. On the horizontal transfer path 22, a plurality of first layer transfer electrode films 32 composed of polysilicon are formed apart from each other on the insulating film 31. A thin oxidized insulating film 34 is formed on the surface of the first layer transfer electrode film 32 and a plurality of second layer transfer electrode films 35 composed of polysilicon are formed so as to fill gaps between the first layer transfer electrode films 32. On the surface of the second layer transfer electrode film 35 is formed an oxidized insulating film 36.

On the vertical transfer path 23 also, a plurality of first layer transfer electrode films 32 are formed apart from each other on the gate insulating film 31 formed on the surface of the semiconductor substrate 30. An oxidized insulating film 37 whose thickness is larger than that of the oxidized insulating film 34 is formed. Second layer transfer electrode films 35 composed of polysilicon are formed so as to fill gaps between the first layer transfer electrode films 32. On the surface of the second layer transfer electrode film 35 is formed an oxidized insulating film 36.

In this way, the film thickness b of the interlayer insulating film 34 between the electrode films 32, 35 of the horizontal transfer path 22 is reduced with respect to the film thickness a of the interlayer insulating film 37 between the electrode films 32, 35 of the vertical transfer path 23 in this embodiment. It is thus possible to reduce the driving voltage used to control transfer in the horizontal transfer path 22 thereby reducing the power consumption of the CCD type solid-state imaging apparatus 20. The following describes a method for manufacturing the horizontal transfer path and the vertical transfer path shown in FIGS. 2A and 2B.

FIGS. 3 through 9 are process charts showing the procedure for manufacturing a horizontal transfer path and a vertical transfer path. The illustrated transfer path range corresponds to the cross section along the line III-III shown in FIG. 1. While the vertical transfer path 23 and the horizontal transfer path 22 are shown to be coupled in communication in FIGS. 3 through 9 (also FIGS. 10 through 15 described later), this is to illustrate the manufacturing process where film thickness differs between the interlayer insulating films 34, 37. In reality, the structure of the junction between the vertical transfer path 23 and the horizontal transfer path 22 is more complicated than illustrated although the details thereof are omitted.

Figure 3:
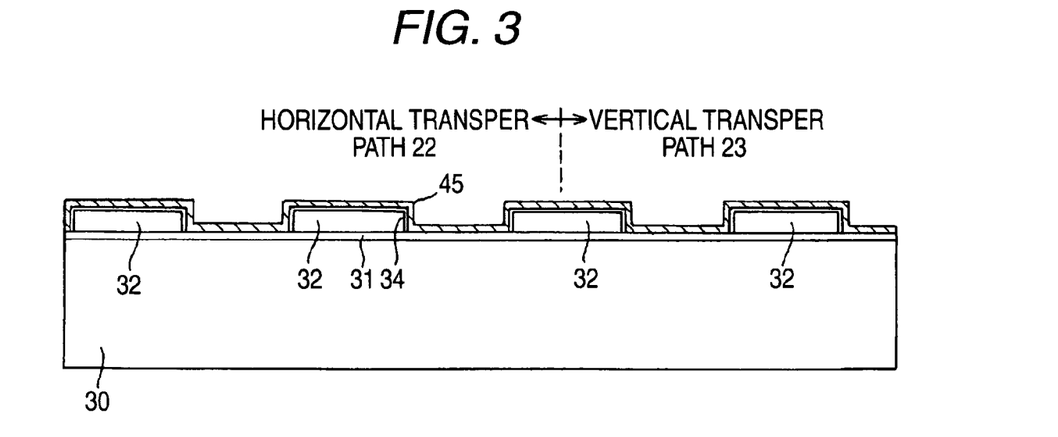
FIG. 3 is a process chart showing the procedure for manufacturing CCD type solid-state imaging apparatus according to the first embodiment of the invention.

As shown in FIG. 3, a gate insulating film 31 of the ONO (oxidized film-silicon nitride film-oxidized film) structure is formed on the semiconductor substrate 30. On the gate insulating film 31 is formed first layer transfer electrode films 32 composed of polysilicon are formed apart from each other, and a thin thermally oxidized film 34 is formed on its surface. Then, an $Si_3N_4$ film 45 is formed on the entire substrate.

Figure 4:
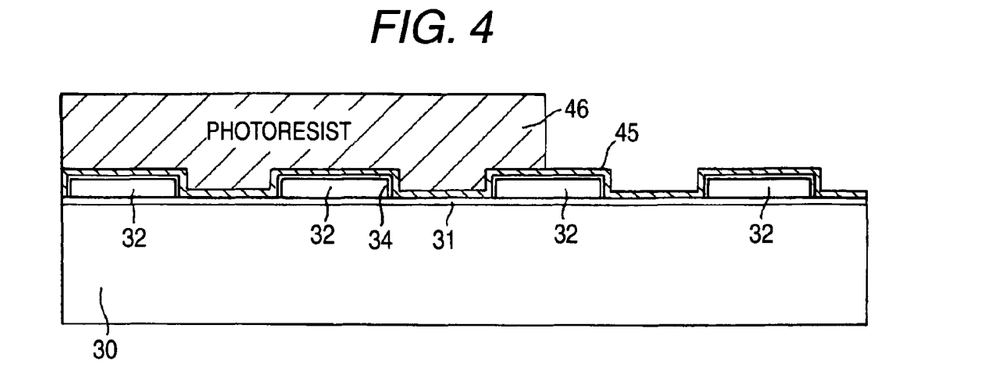
FIG. 4 is a process chart subsequent to FIG. 3 showing the procedure for manufacturing CCD type solid-state imaging apparatus.
Figure 5:
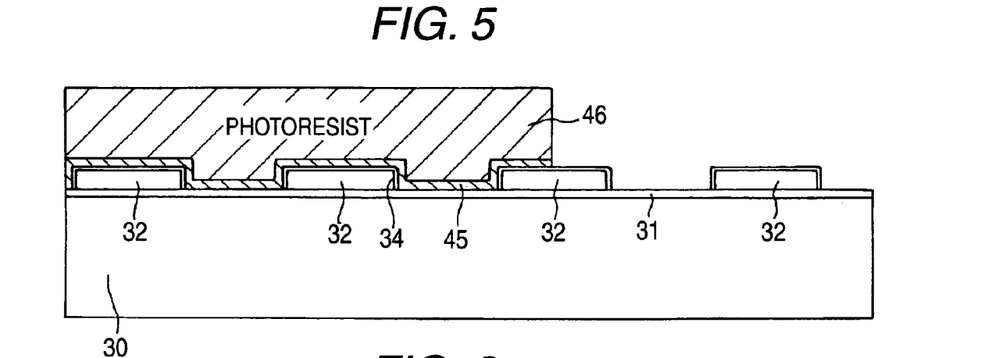
FIG. 5 is a process chart subsequent to FIG. 4 showing the procedure for manufacturing CCD type solid-state imaging apparatus.
Figure 6:
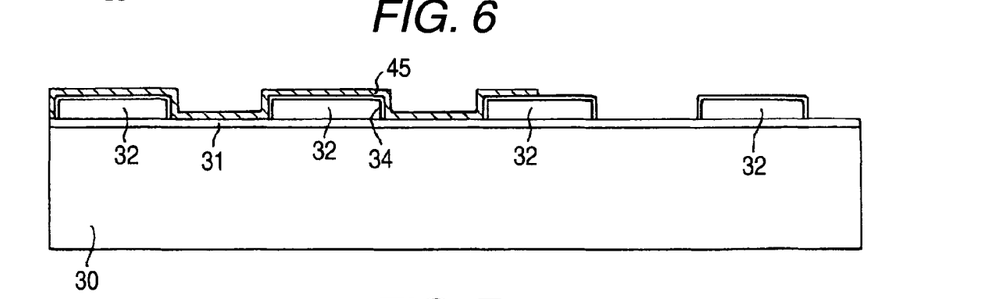
FIG. 6 is a process chart subsequent to FIG. 5 showing the procedure for manufacturing CCD type solid-state imaging apparatus.

Next, as shown in FIG. 4, a photoresist 46 is applied to the horizontal transfer path 22. As shown in FIG. 5, a photolithography process is executed to remove the $Si_3N_4$ film 45 on the vertical transfer path 23. Then, as shown in FIG. 6, the photoresist 46 is removed.

Figure 7:
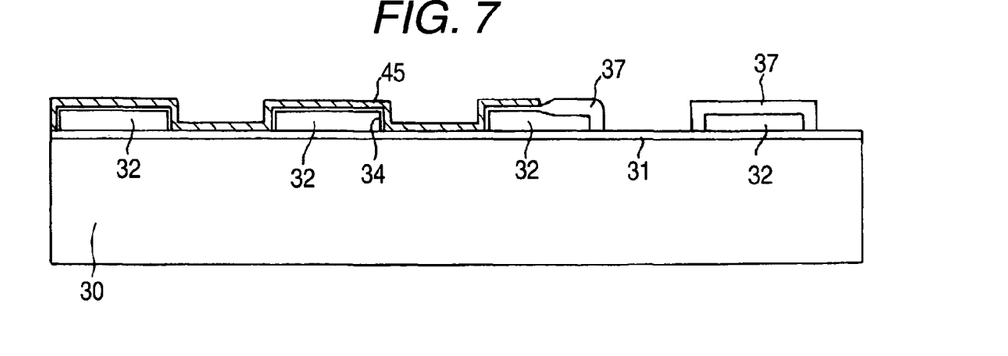
FIG. 7 is a process chart subsequent to FIG. 6 showing the procedure for manufacturing CCD type solid-state imaging apparatus.
Figure 8:
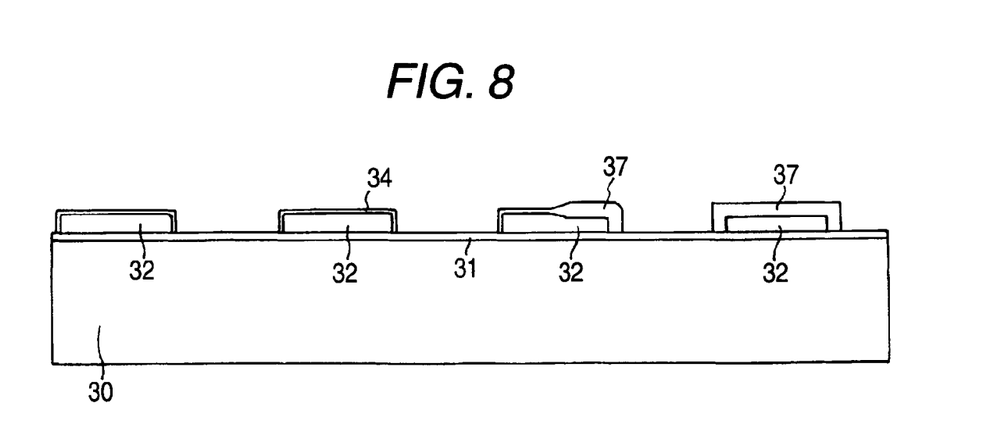
FIG. 8 is a process chart subsequent to FIG. 7 showing the procedure for manufacturing CCD type solid-state imaging apparatus.
Figure 9:
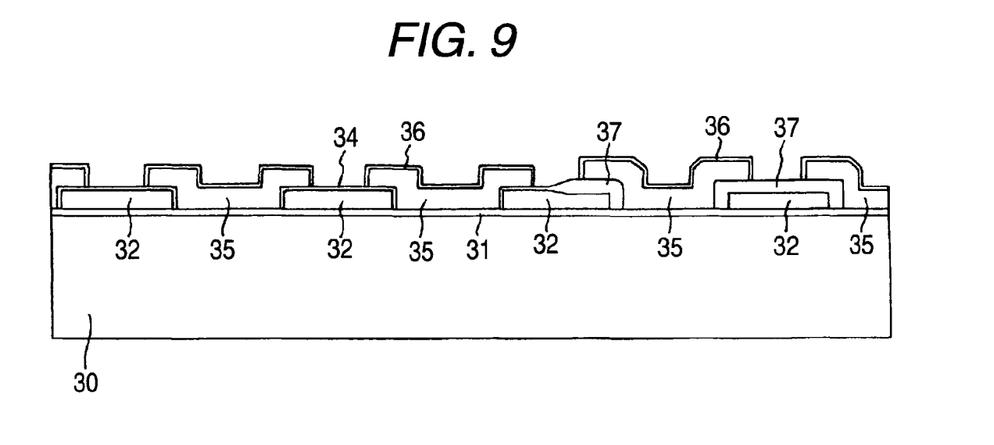
FIG. 9 is a process chart subsequent to FIG. 8 showing the procedure for manufacturing CCD type solid-state imaging apparatus.

Next, as shown in FIG. 7, when the oxidization process is executed, the oxidized film on the surface of the first layer transfer electrode film 32 of the first vertical transfer path 23 grows thick to form an oxidized film 37 shown in FIG. 2B. Then, as shown in FIG. 8, the $Si_3N_4$ film 45 on the horizontal transfer path 22 is removed using the same method as that used to remove the $Si_3N_4$ film 45 in the vertical transfer path 23 in FIGS. 3 and 4. As shown in FIG. 9, second layer transfer electrode films 35 are formed between the first layer transfer electrode films 32 and its surface is thermally oxidized to form an oxidized film 36.

With this manufacturing method, it is possible to increase the thickness of the interlayer insulating film 37 between the first and second layer transfer electrode films 32, 35 on the vertical transfer path 23 to withstand the high driving voltage of the vertical transfer path 23 as well as to reduce the thickness of the interlayer insulating film 34 between the first and second layer transfer electrode films 32, 35 on the horizontal transfer path to reduce the driving voltage of the horizontal transfer path 22 thereby saving the driving power of the horizontal transfer path 22.

Second Embodiment

Figure 10:
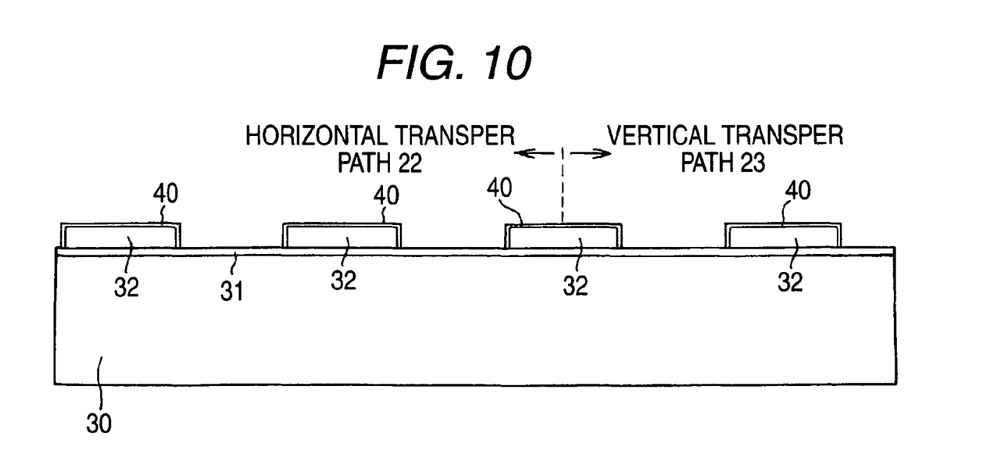
FIG. 10 is a process chart showing the procedure for manufacturing CCD type solid-state imaging apparatus according to the second embodiment of the invention.

FIGS. 10 through 15 are process charts showing the procedure for manufacturing a horizontal transfer path and a vertical transfer path according to the second embodiment of the invention. As shown in FIG. 10, a gate insulating film 31 of the ONO (oxidized film-silicon nitride film-oxidized film) structure is formed on the semiconductor substrate 30. On the gate insulating film 31 is formed first layer transfer electrode films 32 composed of polysilicon are formed apart from each other, and a thermally oxidized film 40 is formed on its surface. Then, a thermally oxidized film 40 is formed thereon.

Figure 11:
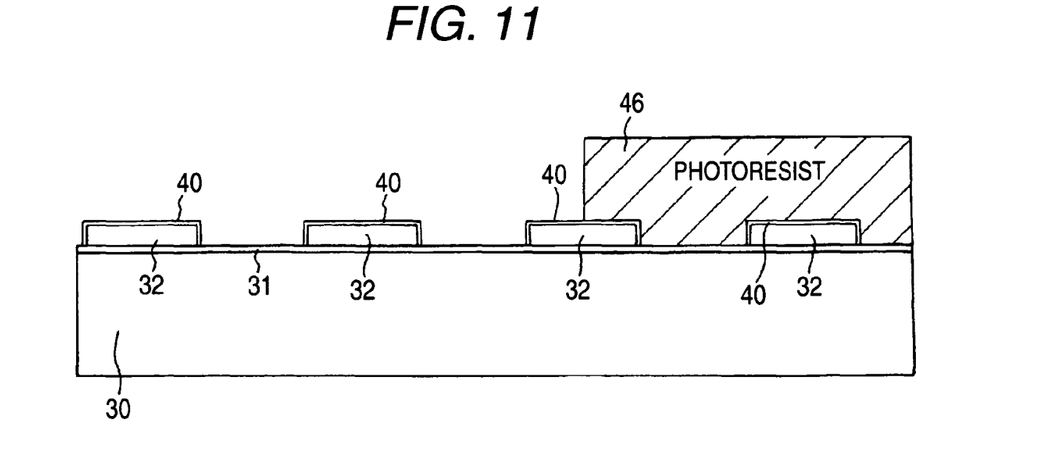
FIG. 11 is a process chart subsequent to FIG. 10 showing the procedure for manufacturing CCD type solid-state imaging apparatus.
Figure 12:
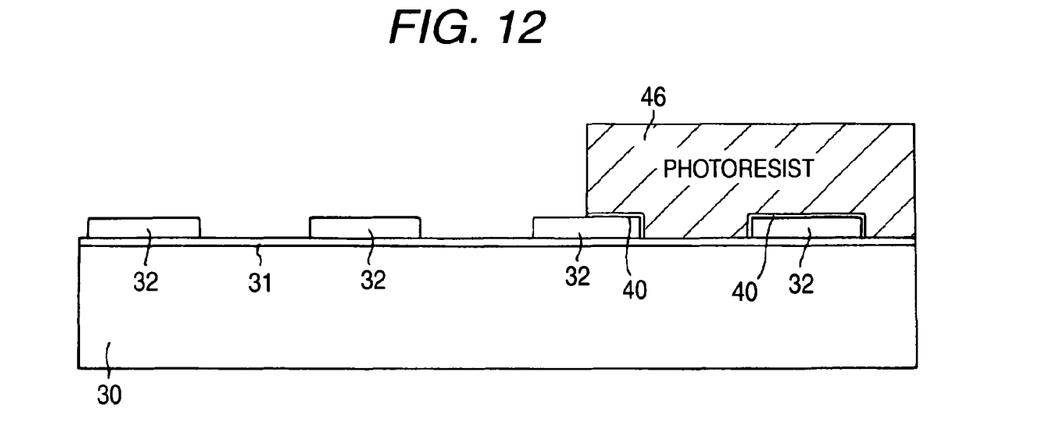
FIG. 12 is a process chart subsequent to FIG. 11 showing the procedure for manufacturing CCD type solid-state imaging apparatus.
Figure 13:
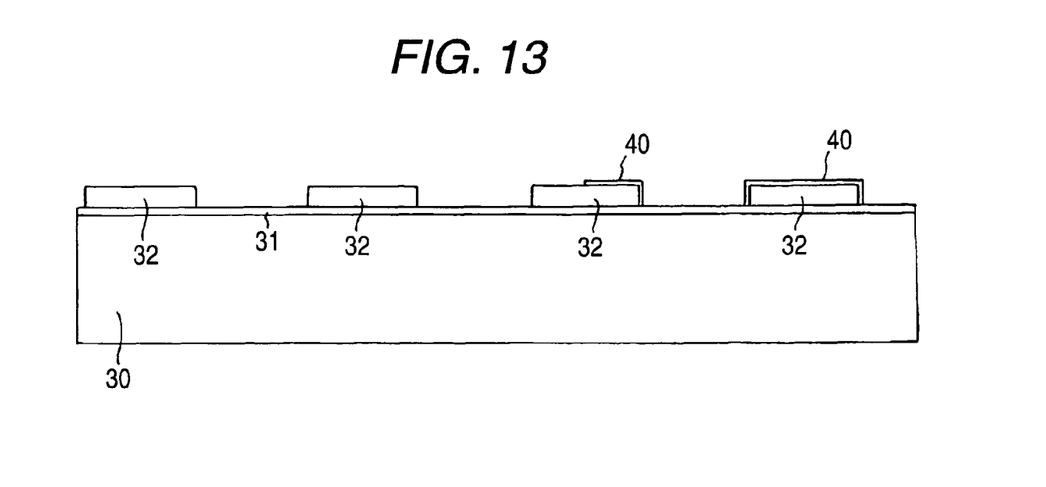
FIG. 13 is a process chart subsequent to FIG. 12 showing the procedure for manufacturing CCD type solid-state imaging apparatus.

Next, as shown in FIG. 11, a photoresist 46 is applied to the vertical transfer path 23. As shown in FIG. 12, a photolithography process is executed to remove the thermally oxidized film 40 on the horizontal transfer path 22. Then, as shown in FIG. 13, the photoresist 46 is removed.

Figure 14:
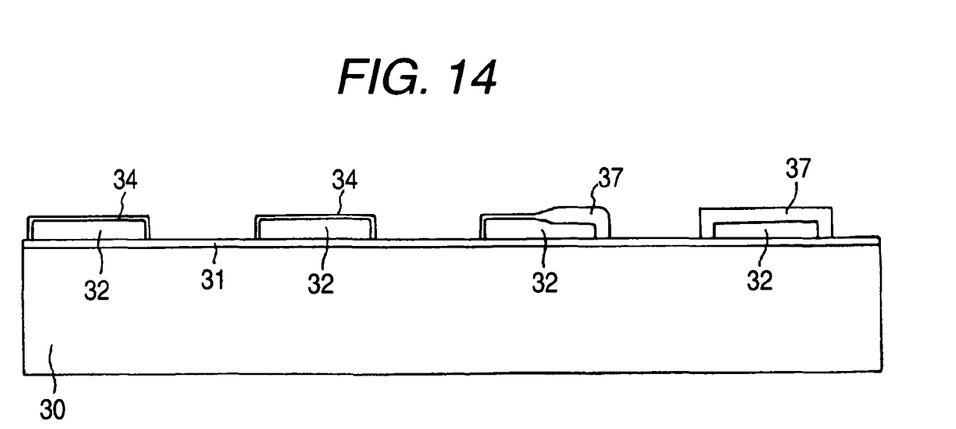
FIG. 14 is a process chart subsequent to FIG. 13 showing the procedure for manufacturing CCD type solid-state imaging apparatus according to the second embodiment of the invention.

Next, as shown in FIG. 14, when the oxidization process is executed, a thin oxidized film 34 grows anew on the surface of the first layer transfer electrode film 32 on the horizontal transfer path 22. A new oxidized film grows on the oxidized film 40 on the vertical transfer path 23 shown in FIG. 13 to form a thick oxidized film 37.

Figure 15:
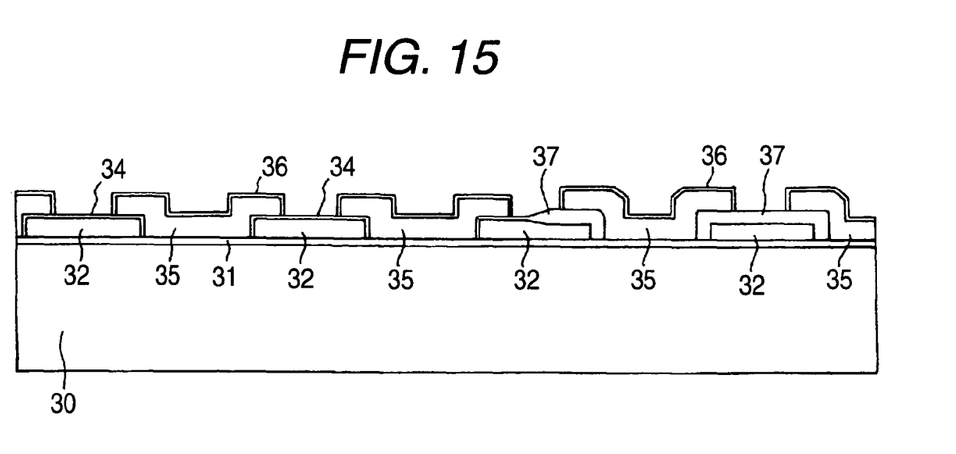
FIG. 15 is a process chart subsequent to FIG. 14 showing the procedure for manufacturing CCD type solid-state imaging apparatus according to the second embodiment of the invention.

Then, as shown in FIG. 15, second layer transfer electrode films 35 are formed between the first layer transfer electrode films 32 and their surfaces are thermally oxidized to form oxidized films 36.

With this manufacturing method also, it is possible to increase the thickness of the interlayer insulating film 37 between the first and second layer transfer electrode films 32, 35 on the vertical transfer path 23 to withstand the high driving voltage of the vertical transfer path 23 as well as to reduce the thickness of the interlayer insulating film 34 between the first and second layer transfer electrode films 32, 35 on the horizontal transfer path to reduce the driving voltage of the horizontal transfer path 22 thereby saving the driving power of the horizontal transfer path 22.

Third Embodiment

Figure 16A:
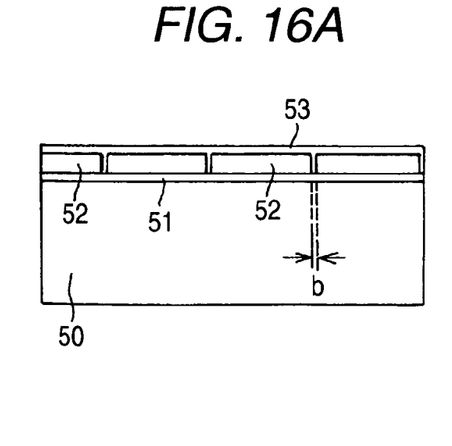
FIG. 16A is a partial schematic cross-sectional view of a horizontal transfer path of the CCD type solid-state imaging apparatus according to the third embodiment of the invention.
Figure 16B:
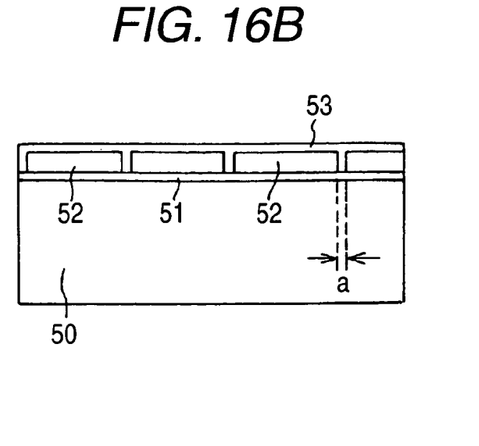
FIG. 16B is a partial schematic cross-sectional view of a vertical transfer path of the CCD type solid-state imaging apparatus according to the third embodiment of the invention.

FIG. 16 is a partial schematic cross-sectional view of a horizontal transfer path (FIG. 16A) and a vertical transfer path (FIG. 16B) having a single-layer structure according to the third embodiment of the invention. In this embodiment, a gate insulating film 51 of the ONO structure is formed on the surface of the semiconductor substrate 50. On the gate insulating film 51 are formed a plurality of transfer electrode films 52 adjacently to each other with minute gaps arranged therebetween. Each transfer electrode film 52 is covered with an insulating film 53 thus filling each gap between the transfer electrode films 52 with the insulating film 53.

Talking of the gap between the transfer electrode films 52, the gap a on the vertical transfer path (FIG. 16B) is wide enough to have a withstand voltage against a high driving voltage while the gap b on the horizontal transfer path (FIG. 16A) is narrow so as to reduce the driving voltage to provide lower power consumption.

The CCD type solid-state imaging apparatus having transfer paths of such a single-layer structure also saves the driving power of the horizontal transfer path of the CCD type solid-state imaging apparatus.

The CCD type solid-state imaging apparatus according to the invention has a thin insulating film between the transfer electrode films on the second transfer paths. This reduces the transfer driving voltage of the second transfer path thus reducing power consumption.

The CCD type solid-state imaging apparatus according to the invention can save the driving power of the horizontal transfer path and is thus useful as CCD type solid-state imaging apparatus mounted on electronic equipment having a small battery alone such as a digital still camera and a cell phone.

The entire disclosure of each and every foreign patent application from which the benefit of foreign priority has been claimed in the present application is incorporated herein by reference, as if fully set forth.

What is claimed is:

1. A method for manufacturing a CCD type solid-state imaging apparatus, the method comprising:
   forming a first insulating film on a semiconductor substrate;
   forming, on the first insulating film, a plurality of seperated first layer transfer electrode films constituting a plurality of first transfer paths and a second transfer path;
   forming first oxidized films on surfaces of the first layer transfer electrode films by way of an oxidization process;
   forming a second insulating film covering the first transfer paths and the second transfer path;
   removing the second insulating film on the first transfer paths by way of a photolithography process;
   growing the first oxidized films on the surfaces of the first layer transfer electrode films on the first transfer paths;
   removing the second insulating film on the second transfer path; and
   forming a plurality of the second layer transfer electrode films filling gaps between the first layer transfer electrode films and whose ends are laminated on ends of the first layer transfer electrode films adjacent thereto.

2. A method for manufacturing a CCD type solid-state imaging apparatus, the method comprising:
   forming a first insulating film on a semiconductor substrate;
   forming, on the first insulating film, a plurality of separated first layer transfer electrode films constituting a plurality of first transfer paths and a second transfer path;
   forming first oxidized films on a surface of the first layer transfer electrode films by way of a first oxidization process;
   removing the first oxidized films on surfaces of the first layer transfer electrode films on the first transfer paths by way of a photolithography process;
   growing an oxidized film on each of surfaces of the first layer transfer electrode films on the first transfer paths and surfaces of the first layer transfer electrode films on the second transfer path by way of a second oxidization process; and
   forming a plurality of second layer transfer electrode films filling gaps between the first layer transfer electrode films and whose ends are laminated on ends of the first layer transfer electrode films adjacent thereto.

* * * * *